United States Patent
Mantani et al.

(10) Patent No.: US 9,321,076 B2
(45) Date of Patent: Apr. 26, 2016

(54) SCREEN PRINTING APPARATUS, ELECTRONIC COMPONENT MOUNTING SYSTEM AND SCREEN PRINTING METHOD

(71) Applicant: PANASONIC INTELLECTUAL PROPERTY MANAGEMENT CO., LTD., Osaka (JP)

(72) Inventors: Masayuki Mantani, Yamanashi (JP); Michinori Tomomatsu, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/602,540

(22) Filed: Jan. 22, 2015

(65) Prior Publication Data
US 2015/0216058 A1 Jul. 30, 2015

(30) Foreign Application Priority Data
Jan. 29, 2014 (JP) ................................ 2014-014044

(51) Int. Cl.
*B41F 15/12* (2006.01)
*B41F 15/16* (2006.01)
*B41F 15/26* (2006.01)
(Continued)

(52) U.S. Cl.
CPC ................ *B05D 1/32* (2013.01); *B05C 21/005* (2013.01); *B23K 1/008* (2013.01); *B23K 1/0016* (2013.01); *B23K 3/0638* (2013.01); *B23K 3/087* (2013.01); *B23K 37/0443* (2013.01); *B41F 15/12* (2013.01); *B41F 15/16* (2013.01); *B41M 1/12* (2013.01); *H05K 3/1233* (2013.01); *B23K 2201/42* (2013.01); *H05K 3/3484* (2013.01)

(58) Field of Classification Search
CPC .... B05C 21/00; B05C 21/005; H05K 3/1233; H05K 3/3484; H05K 3/1216; B05D 1/32; B23K 37/0443; B23K 37/0435; B41F 15/08; B41F 15/12; B41F 15/14; B41F 15/16; B41F 15/18; B41F 15/20; B41F 15/26; B41F 15/0813
USPC ........................................................ 101/126
See application file for complete search history.

(56) References Cited

U.S. PATENT DOCUMENTS 6,129,014 A * 10/2000 Tani ........................ B41F 15/16
                                                    101/126
2011/0192295 A1* 8/2011 Igarashi et al. .......... B41F 15/20
                                                    101/123

FOREIGN PATENT DOCUMENTS

JP         11048443 A    *   2/1999
JP         11097832 A    *   4/1999
JP      2007-030356 A        2/2007

*Primary Examiner* — Leslie J Evanisko
(74) *Attorney, Agent, or Firm* — Pearne & Gordon LLP

(57) ABSTRACT

A screen printing apparatus includes a substrate positioning part that upwardly and downwardly moves a substrate with the substrate clamped by a clamp member to thereby bring the substrate into contact with a mask stretched in a frame body and fixed in a predetermined height position from an underside of the mask and position the substrate in a predetermined height position, a mask suction part that is provided in the clamp member and sucks the mask in contact with the substrate, and a screen printing part that prints paste on the substrate through a pattern hole formed in the mask by sliding a squeegee on the mask to which the paste is supplied. The mask is pressed up by a predetermined amount through the substrate with the mask sucked by the mask suction part when the substrate is upwardly moved by the substrate positioning part.

12 Claims, 9 Drawing Sheets

(51) Int. Cl.
*B05D 1/32* (2006.01)
*B05C 21/00* (2006.01)
*B41M 1/12* (2006.01)
*B23K 1/00* (2006.01)
*B23K 1/008* (2006.01)
*B23K 3/06* (2006.01)
*B23K 3/08* (2006.01)
*B23K 37/04* (2006.01)
*H05K 3/12* (2006.01)
*H05K 3/34* (2006.01)

SCREEN PRINTING APPARATUS, ELECTRONIC COMPONENT MOUNTING SYSTEM AND SCREEN PRINTING METHOD

CROSS REFERENCE TO RELATED APPLICATION(S)

The present disclosure relates to the subject matters contained in Japanese Patent Application No. 2014-014044 filed on Jan. 29, 2014, which are incorporated herein by reference in its entirety.

FIELD

One or more embodiments of the present invention relate to a screen printing apparatus for printing paste on a substrate, an electronic component mounting system including this screen printing apparatus, and a screen printing method.

BACKGROUND

An electronic component mounting system configured to arrange plural component mounting apparatuses for mounting electronic components on a substrate is widely known in the electronic component mounting field. One of the component mounting apparatuses includes a screen printing apparatus having a function of printing paste such as conductive paste or cream solder on the substrate (for example, see below described Patent Reference 1).

In the screen printing apparatus shown in Patent Reference 1, the substrate is upwardly moved with the substrate clamped from both sides by a pair of clamp members, and is stopped in a position where the substrate is in contact with a lower surface of a mask in which pattern holes are formed. Then, a suction part provided in each of the clamp members sucks the mask to bring the substrate into close contact with the mask. By sliding a squeegee on the mask to which paste is supplied in this state, the paste is printed on the substrate through the pattern holes. The mask used in such a screen printing apparatus is fixed in a predetermined height position in a state stretched in a frame body with a rectangular frame shape.

Patent Reference 1 is JP-A-2007-30356.

SUMMARY

However, in the related-art screen printing apparatus, the following problem may occur due to quality of a frame body of a mask. That is, as the frame body of the mask, a hollow rectangular tube made of aluminum is generally used. However, from a view point of a reduction in manufacturing cost etc., some aluminum rectangular tubes are thin and such a thin frame body is low in strength, with the result that strain tends to occur in a manufacturing stage etc. Also, in a process in which production of substrates is performed over a long period with the frame body incorporated into the screen printing apparatus, strain may occur in the frame body due to deterioration with time. When the mask is stretched in the frame body in which strain occurs, or when strain occurs in the frame body in which the mask is stretched, the mask often becomes inclined with respect to a horizontal plane. Even when the substrate is upwardly moved and is brought into contact with such an inclined mask, it becomes difficult to bring the whole area of an upper surface the substrate into close contact with the mask. As a result, paste could not be printed uniformly in plural print positions set in the substrate and print quality may be deteriorated.

Hence, an object of the embodiments of the invention is to provide a screen printing apparatus, an electronic component mounting system and a screen printing method capable of implementing high-quality printing even when a mask is fixed in an inclined state.

According to the embodiments of the invention, there is provided a screen printing apparatus including: a substrate positioning part that upwardly and downwardly moves a substrate with the substrate clamped by a clamp member to thereby bring the substrate into contact with a mask stretched in a frame body and fixed in a predetermined height position from an underside of the mask and position the substrate in a predetermined height position, a mask suction part that is provided in the clamp member and sucks the mask in contact with the substrate, and a screen printing part that prints paste on the substrate through a pattern hole formed in the mask by sliding a squeegee on the mask to which the paste is supplied, wherein the mask is pressed up by a predetermined amount through the substrate with the mask sucked by the mask suction part when the substrate is upwardly moved by the substrate positioning part.

According to the embodiments of the invention, there is provided an electronic component mounting system including the screen printing apparatus according to the embodiments, and an electronic component mounting apparatus that mounts an electronic component on the substrate on which the paste is printed in the screen printing apparatus.

According to the embodiments of the invention, there is provided a screen printing method including: a substrate positioning step of upwardly and downwardly moving a substrate with the substrate clamped by a clamp member to thereby bring the substrate into contact with a mask stretched in a frame body and fixed in a predetermined height position from an underside of the mask and position the substrate in a predetermined height position, and a screen printing step of printing paste on the substrate through a pattern hole formed in the mask by sliding a squeegee on the mask to which paste is supplied, wherein the mask is pressed up by a predetermined amount through the substrate with the mask sucked by a mask suction part provided in the clamp member when the substrate is upwardly moved in the substrate positioning step.

According to the embodiments of the invention, high-quality printing can be implemented even when the mask is fixed in an inclined state.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS

Figure 1:
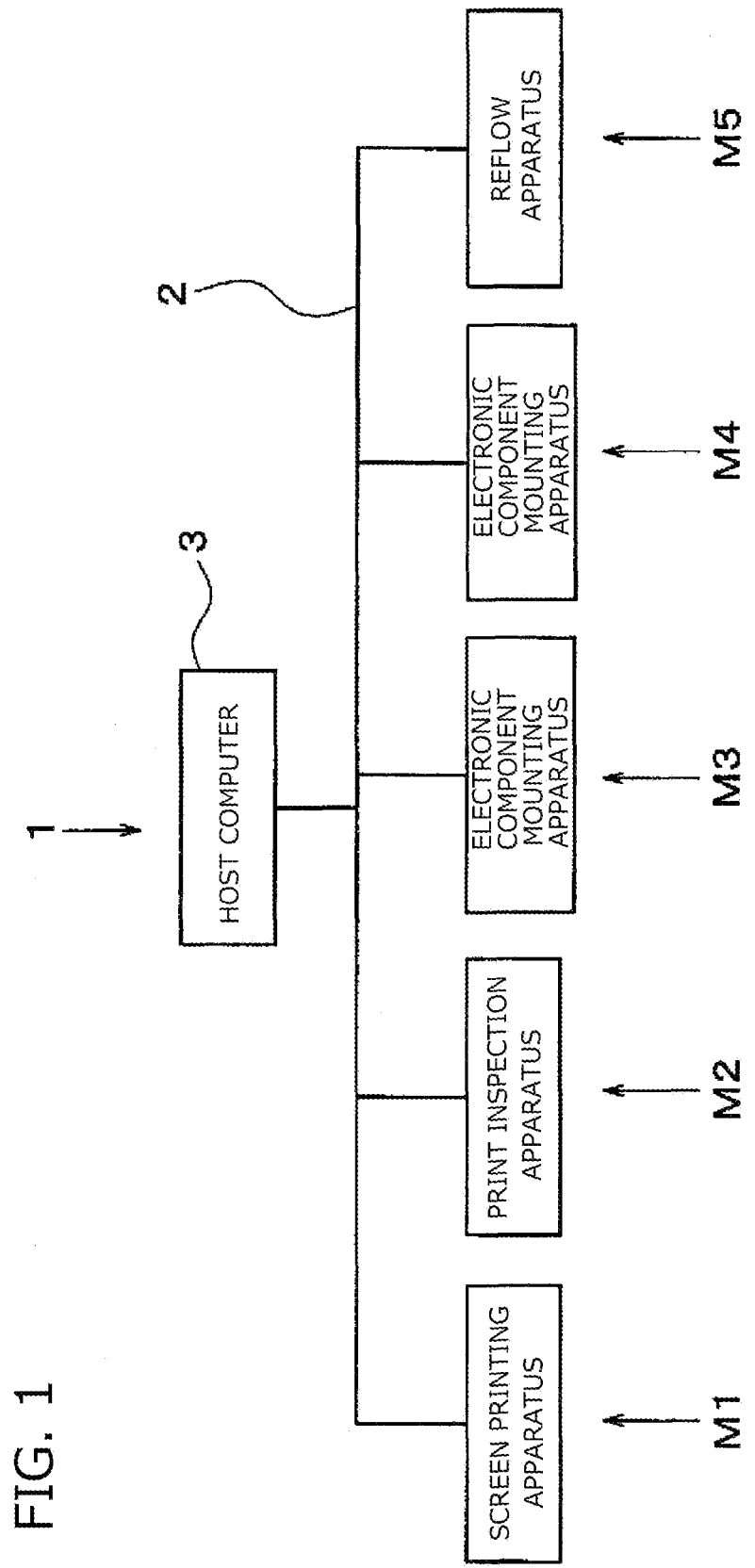
FIG. 1 is the whole configuration diagram of an electronic component mounting system in an embodiment of the invention.

First, the whole configuration of an electronic component mounting system in an embodiment of the invention will be described with reference to FIG. 1. An electronic component mounting system 1 has a function of mounting electronic components on a substrate by soldering, and mainly includes amounting line for joining plural component mounting apparatuses including a screen printing apparatus M1, a print inspection apparatus M2, electronic component installation apparatuses M3, M4 and a reflow apparatus M5. These component mounting apparatuses M1 to M5 are connected to a host computer 3 through a communication network 2.

The screen printing apparatus M1 performs screen printing of paste such as cream solder containing solder particles on electrodes for electronic component bonding formed on the substrate. The print inspection apparatus M2 decides whether a print state of the paste printed on the substrate is good or bad, and performs a print inspection including detection of print displacement of the paste on the electrodes. The electronic component installation apparatuses M3 and M4 install the electronic components on the substrate on which the paste is printed in the screen printing apparatus M1. The reflow apparatus M5 heats the substrate after the electronic component installation according to a predetermined temperature profile to thereby melt the solder particles in the paste to solder the electronic components to the electrode of the substrate.

Figure 2:
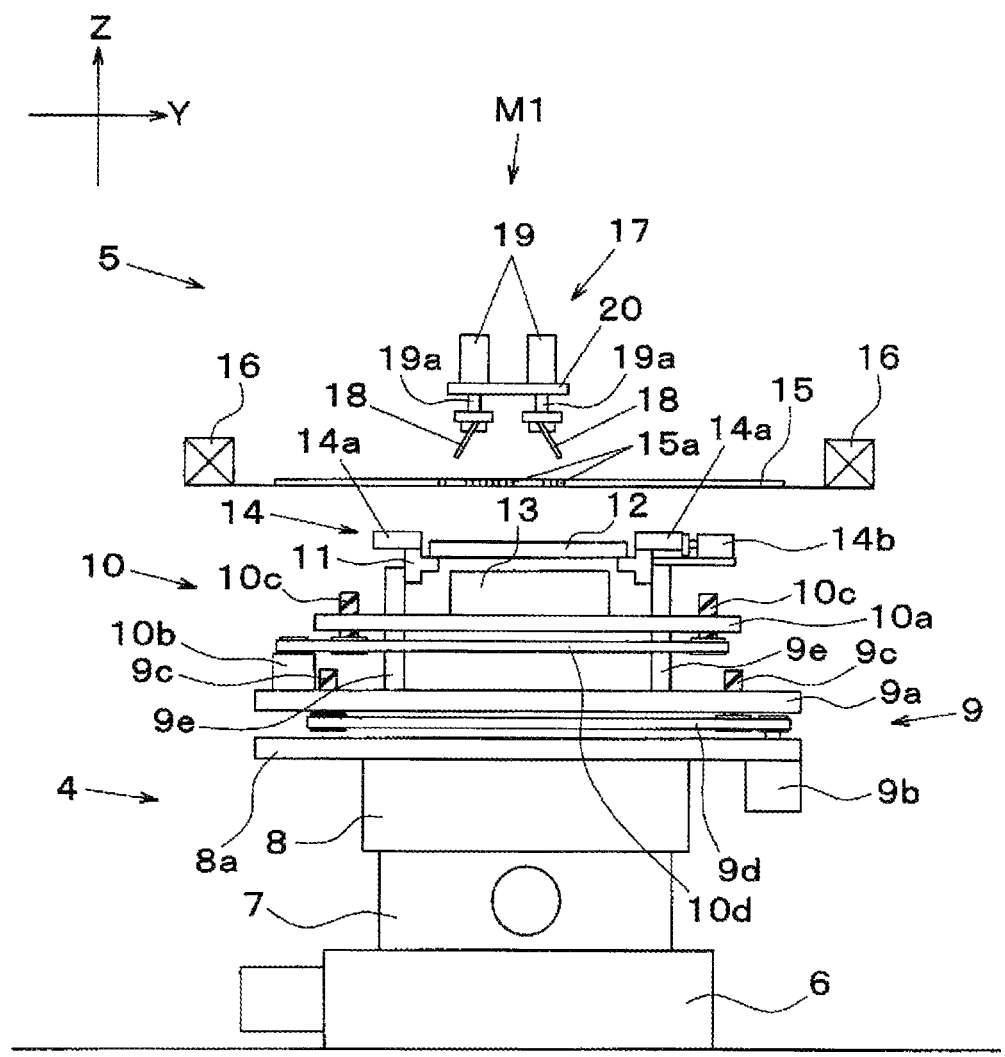
FIG. 2 is a front view of a screen printing apparatus in the embodiment of the invention.

Next, a structure of the screen printing apparatus M1 will be described with reference to FIGS. 2 to 5B. In FIG. 2, the screen printing apparatus M1 is configured to arrange a screen printing part 5 over a substrate positioning part 4. The substrate positioning part 4 is configured to stack a Y-axis table 6, an X-axis table 7 and a θ-axis table 8 and further combine a first Z-axis table 9 and a second Z-axis table 10 thereon. By driving the Y-axis table 6, the X-axis table 7 and the θ-axis table 8, the first Z-axis table 9 and the second Z-axis table 10 are moved in an X direction (direction vertical to the paper in FIG. 2) which is a substrate conveyance direction, and a Y direction orthogonal to the X direction in a horizontal plane, and are also rotated horizontally.

A configuration of the first Z-axis table 9 will be described. In the upper surface side of a horizontal base plate 8a provided on an upper surface of the θ-axis table 8, a similarly horizontal base plate 9a is held upwardly and downwardly movably by an elevation guide mechanism (not shown). The base plate 9a is upwardly and downwardly moved by a Z-axis elevation mechanism configured to rotate and drive plural feed screws 9c through a belt 9d by a motor 9b.

Figure 3:
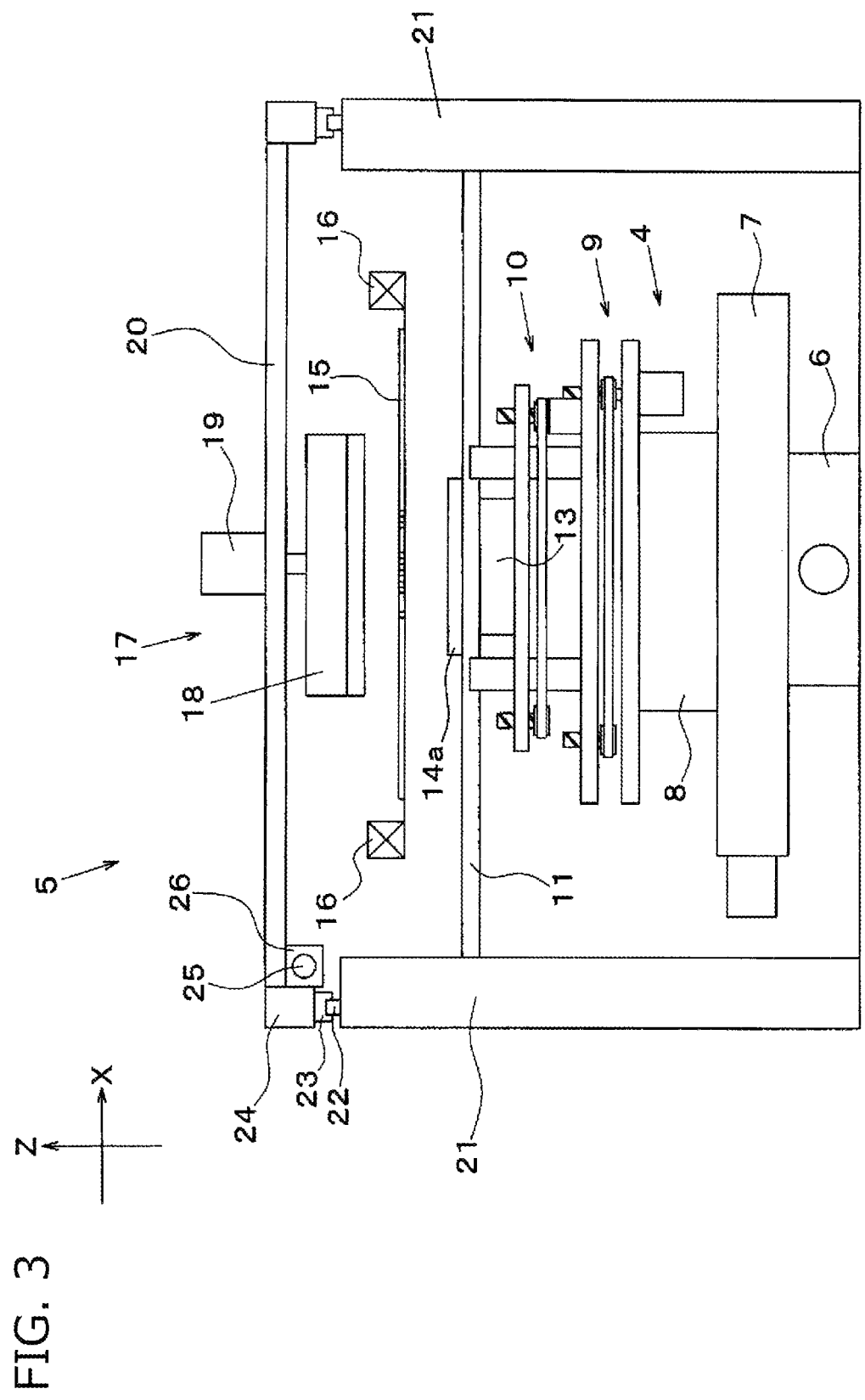
FIG. 3 is a side view of the screen printing apparatus in the embodiment of the invention.
Figure 4A:
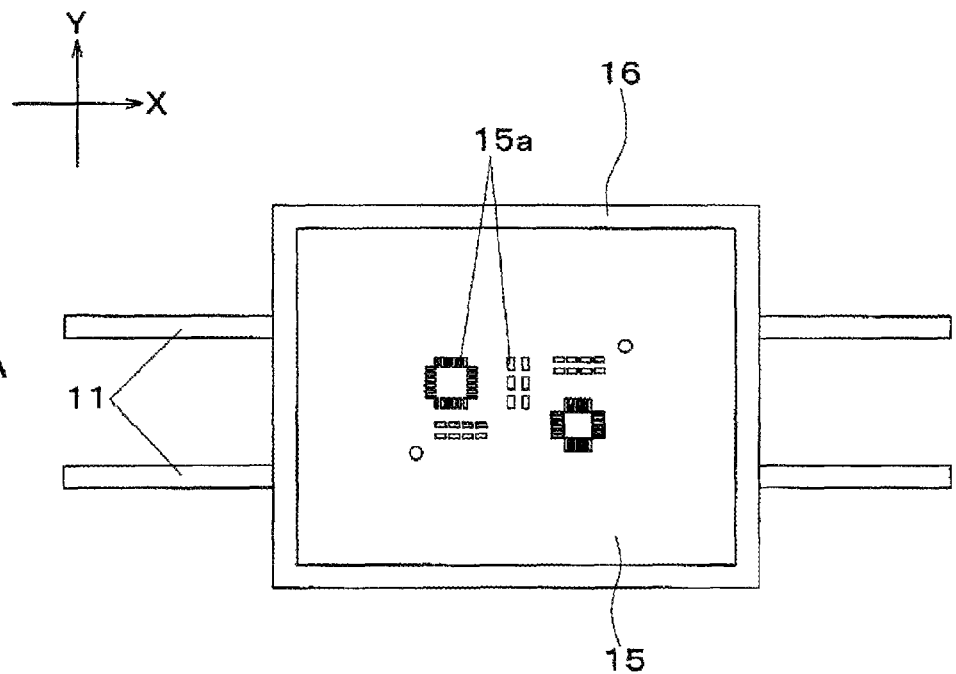
FIGS. 4A and 4B are partially plan views of the screen printing apparatus in the embodiment of the invention.
Figure 4B:
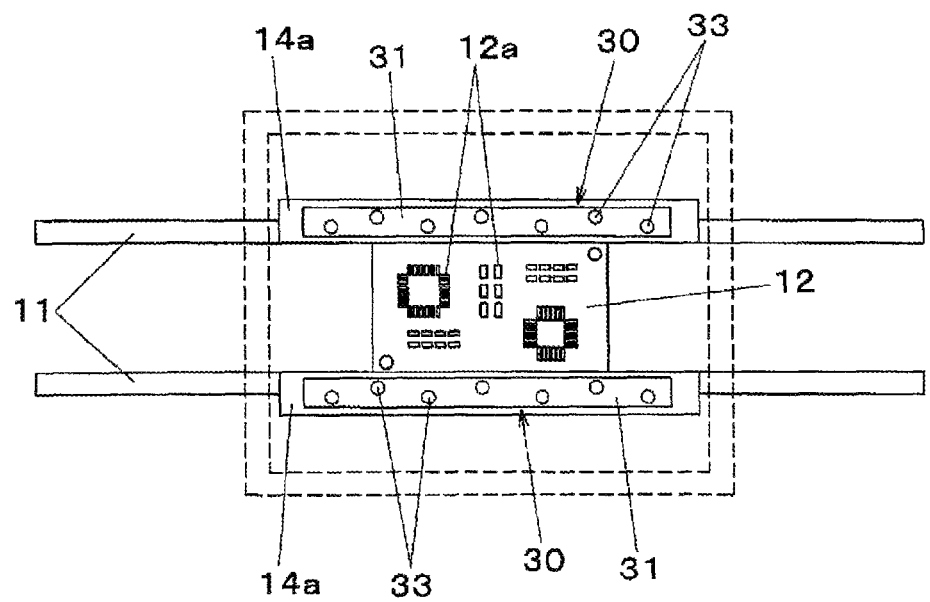

A vertical frame 9e is erected on the base plate 9a, and a substrate conveyance mechanism 11 is held in the upper end of the vertical frame 9e. The substrate conveyance mechanism 11 includes two conveyance rails arranged parallel in the X direction, and conveys a substrate 12 with both ends of the substrate 12 supported by each of the conveyance rails. By driving the first Z-axis table 9, the substrate 12 held by substrate conveyance mechanism 11 can be upwardly and downwardly moved with respect to the screen printing part 5 together with the substrate conveyance mechanism 11. As shown in FIGS. 3, 4A and 4B, the substrate conveyance mechanism 11 extends to the upstream side (left side in FIGS. 3, 4A and 4B) and the downstream side, and the substrate 12 carried in from the upstream side is conveyed by the substrate conveyance mechanism 11 and is further positioned by the substrate positioning part 4. The substrate 12 after printing is performed by the screen printing part 5 is carried out to the upstream side by the substrate conveyance mechanism 11.

A configuration of the second Z-axis table 10 will be described. Between the substrate conveyance mechanism 11 and the base plate 9a, a horizontal base plate 10a is arranged upwardly and downwardly movably along an elevation guide mechanism (not shown). The base plate 10a is upwardly and downwardly moved by a Z-axis elevation mechanism configured to rotate and drive plural feed screws 10c through a belt 10d by a motor 10b. An upper surface of the base plate 10a is provided with a substrate lower receiving part 13 whose upper surface is provided with a lower receiving surface for holding the substrate 12.

By driving the second Z-axis table 10, the substrate lower receiving part 13 is upwardly and downwardly moved with respect to the substrate 12 in a state held in the substrate conveyance mechanism 11. Then, the lower receiving surface of the substrate lower receiving part 13 abuts on a lower surface of the substrate 12 and thereby, the substrate lower receiving part 13 supports the substrate 12 from the lower surface side. An upper surface of the substrate conveyance mechanism 11 is provided with a clamp mechanism 14. The clamp mechanism 14 includes two clamp members 14a facingly arranged on right and left, and one clamp member 14a is advanced and retracted by a driving mechanism 14b to thereby clamp and fix the substrate 12 from both sides. As shown in FIG. 4B, the clamp member 14a is provided with a mask suction part 30 (details are described below).

By driving the Z-axis table 9 with the substrate 12 clamped by the clamp members 14a, the substrate 12 is upwardly moved while regulating movement in the horizontal plane, and makes contact with a lower surface of a mask 15. Accordingly, the substrate 12 is positioned in a predetermined height position. Thus, the substrate positioning part 4 upwardly and downwardly moves the substrate 12 with the substrate 12 clamped by the clamp members 14a to thereby bring the substrate 12 into contact with the mask 15 from an underside thereof and position the substrate 12 in the predetermined height position.

Next, the screen printing part 5 will be described. In FIG. 4A, the screen printing part 5 includes the mask 15 with a rectangular flat plate shape stretched in a frame body 16. In FIGS. 2 and 3, the frame body 16 is fixed over the substrate positioning part 4 in a predetermined height position, and holds the mask 15 so as to cover the outer edge of the mask 15. Consequently, the mask 15 is also in a state fixed in the predetermined height position. The frame body 16 has various material or structures depending on manufacturers, and a hollow rectangular tube made of aluminum is generally used as the frame body 16. In recent years, from the standpoint of a reduction in manufacturing cost etc., some rectangular tubes are thin, and such a frame body 16 is low in strength and tends to cause strain in a manufacturing stage etc. The mask 15 has flexibility, and pattern holes 15a are formed in correspondence with shapes and positions of electrodes 12a formed in the substrate 12.

A squeegee head 17 is arranged over the mask 15. The squeegee head 17 is configured to arrange plural squeegee elevation mechanisms 19 for upwardly and downwardly moving squeegees 18 in a horizontal plate 20. In FIG. 2, the squeegee elevation mechanism 19 has a rod 19a extending downwardly, and the squeegee 18 is attached to the lower end of the rod 19a. By driving the squeegee elevation mechanisms 19, the squeegees 18 are upwardly and downwardly moved through the rods 19a and abut on an upper surface of the mask 15.

As shown in FIG. 3, guide rails 22 are arranged on longitudinal frames 21 in the Y direction, and sliders 23 slidably fitted into the guide rails 22 are coupled to both ends of the plate 20 through blocks 24. Accordingly, the squeegee head 17 is slidable in the Y direction. The plate 20 is horizontally moved in the Y direction by squeegee head movement means including a nut 26, a feed screw 25, and a squeegee movement motor (not shown) for rotating and driving the feed screw 25.

By performing squeegee operation of sliding the squeegees 18 in the Y direction with the substrate 12 brought into contact with the mask 15, paste Pa (FIGS. 8A to 8C) supplied to the mask 15 is pushed into the pattern holes 15a and is printed on the electrodes 12a. Thus, the screen printing part 5 slides the squeegees on the mask 15 to which the paste Pa is supplied to thereby print the paste Pa on the substrate 12 positioned in a predetermined height position through the pattern holes 15a. Then, the screen printing apparatus M1 in the embodiment brings the substrate 12 into contact with the mask 15 stretched in the frame body 16 and fixed in the predetermined height position, and prints the paste Pa through the pattern hole 15a formed in the mask 15.

Figure 5A:
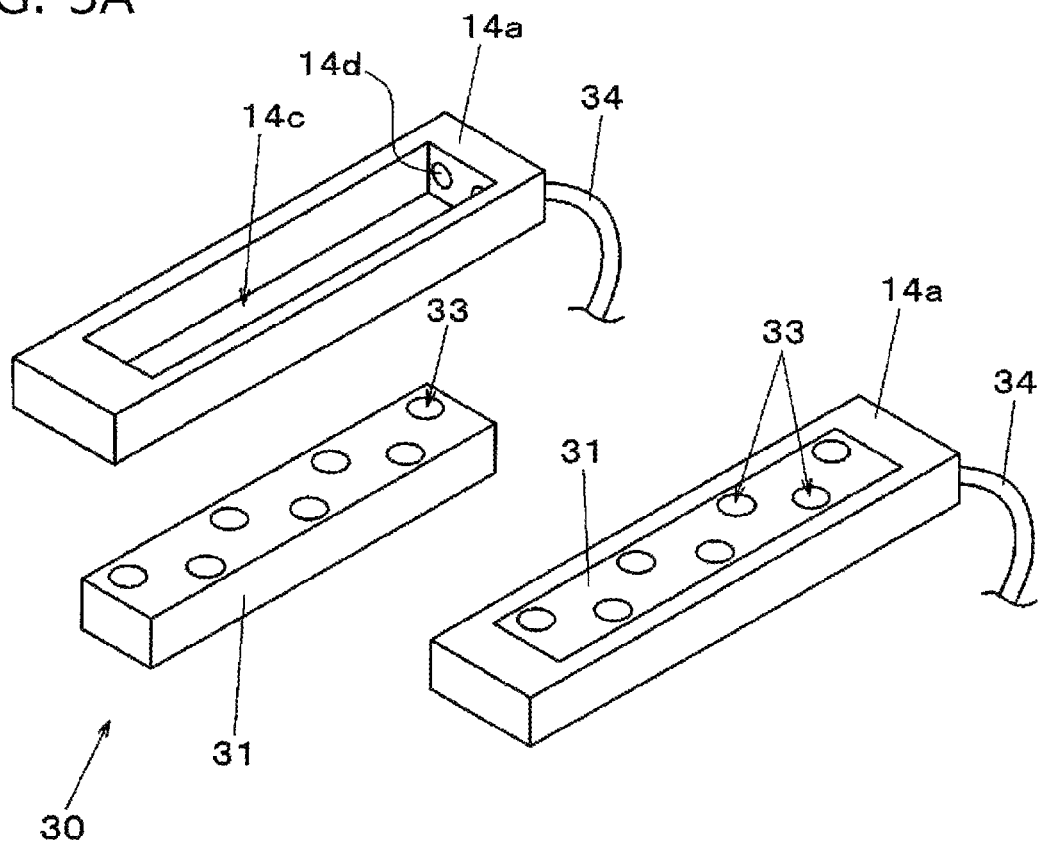
FIGS. 5A and 5B are structural explanatory diagrams of a mask suction part in the embodiment of the invention.
Figure 5B:
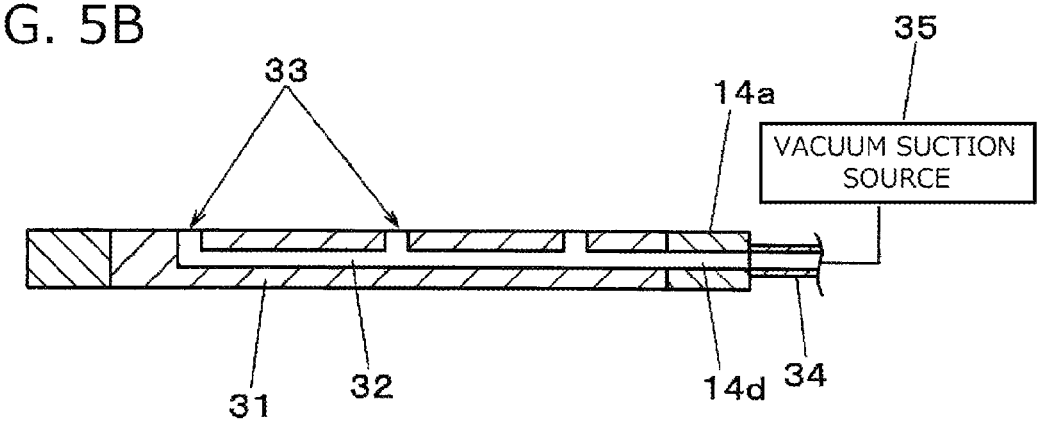

Next, the mask suction part 30 formed in the clamp member 14a will be described. In FIGS. 4B, 5A and 5B, the mask suction part 30 mainly includes a block body 31 extending in the X direction. In the clamp member 14a, a through hole 14c is formed along the line of a shape of the block body 31 and the block body 31 is inserted into the through hole 14c to thereby attach the block body 31 to the clamp member 14a. In this state, an upper surface of the block body 31 becomes the same as an upper surface of the clamp member 14a as shown in FIG. 5B.

As shown in FIG. 5B, a suction path 32 is formed inside the block body 31, and plural openings 33 connected to the suction path 32 are formed in the upper surface of the block body 31. In a state in which the block body 31 is attached to the clamp member 14a, the suction path 32 communicates with a suction path 14d formed inside the clamp member 14a. The suction path 14d is connected to a vacuum suction source 35 through a suction conduit 34 formed in the outside of the clamp member 14a. Consequently, by driving the vacuum suction source 35, a suction force is produced in the openings 33 through the suction paths 32, 14d. Accordingly, when the substrate 12 is brought into contact with the mask 15 with the substrate 12 clamped by the clamp members 14a, the mask 15 can be sucked from the underside thereof through the openings 33. Thus, the mask suction part 30 is formed in the clamp member 14a and sucks the mask 15 in contact with the substrate 12. In addition, a configuration of the mask suction part 30 is not limited to the configuration described above, and various configurations may be adopted.

The screen printing apparatus M1 in the embodiment is configured as described above and next, a screen printing method will be described with reference to operation explanatory diagrams of FIGS. 6A to 9B. A control part (not shown) included by the screen printing apparatus M1 controls each of the mechanisms of the substrate positioning part 4, the mask suction part 30 and the screen printing part 5 based on a previously stored print program to thereby perform the following operation.

Figure 6A:
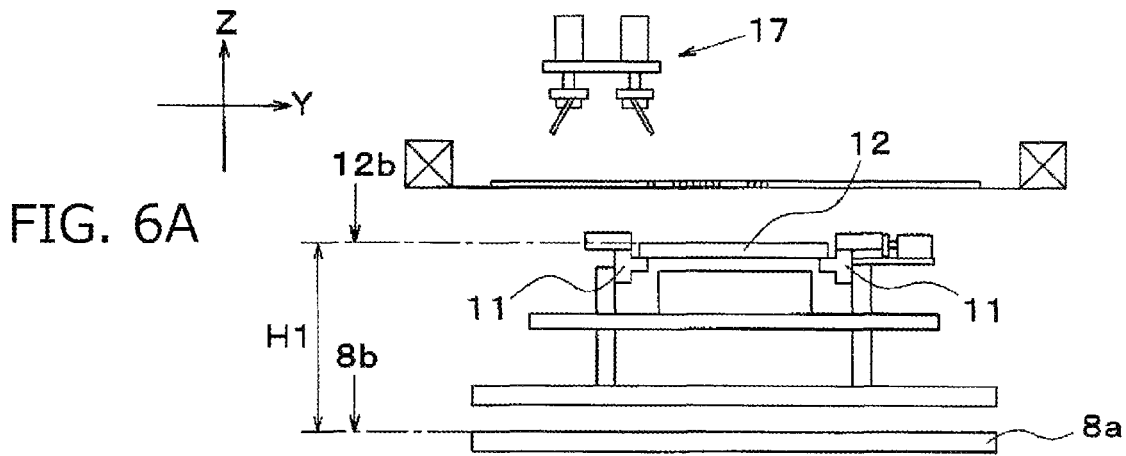
FIGS. 6A to 6C are explanatory diagrams of printing operation in the embodiment of the invention.
Figure 6B:
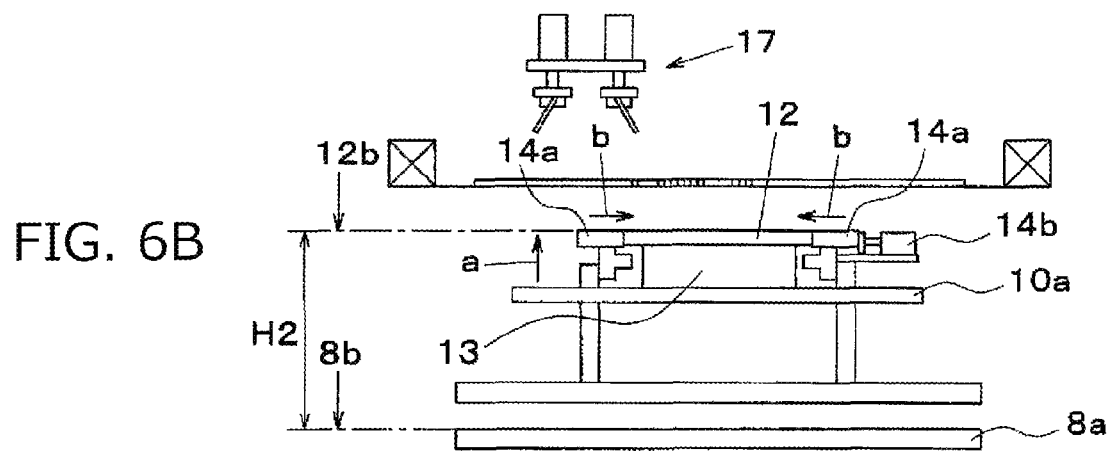

First, operation to a step of positioning the substrate 12 with respect to the mask 15 in the case where strain does not occur in the frame body 16 will be described with reference to FIGS. 6A and 6B. First, as shown in FIG. 6A, the substrate conveyance mechanism 11 conveys the substrate 12 to a predetermined print position (ST1: a substrate conveyance step). In this state, a relative height position of an upper surface 12b of the substrate 12 with respect to an upper surface 8b of the base plate 8a is a substrate height H1. Hereinafter, the relative height position of the upper surface 12b of the substrate 12 with respect to the upper surface 8b of the base plate 8a is called a "substrate height".

Next, the substrate 12 is positioned (ST2: a substrate positioning step). That is, as shown in FIG. 6B, together with the base plate 10a, the substrate lower receiving part 13 is upwardly moved (arrow a) and receives the substrate 12 from an underside thereof. At this time, the substrate lower receiving part 13 is upwardly moved until the upper surface 12b of the substrate 12 reaches the same height position as an upper surface of the clamp member 14a. In this state, a height position of the substrate 12 becomes a substrate height H2. Then, the clamp members 14a are horizontally moved to clamp the substrate 12 (arrow b). Accordingly, in the substrate 12, movement in the horizontal plane is regulated and in this state, the substrate positioning part 4 aligns the substrate 12 in the horizontal plane (YYθ direction).

Figure 6C:
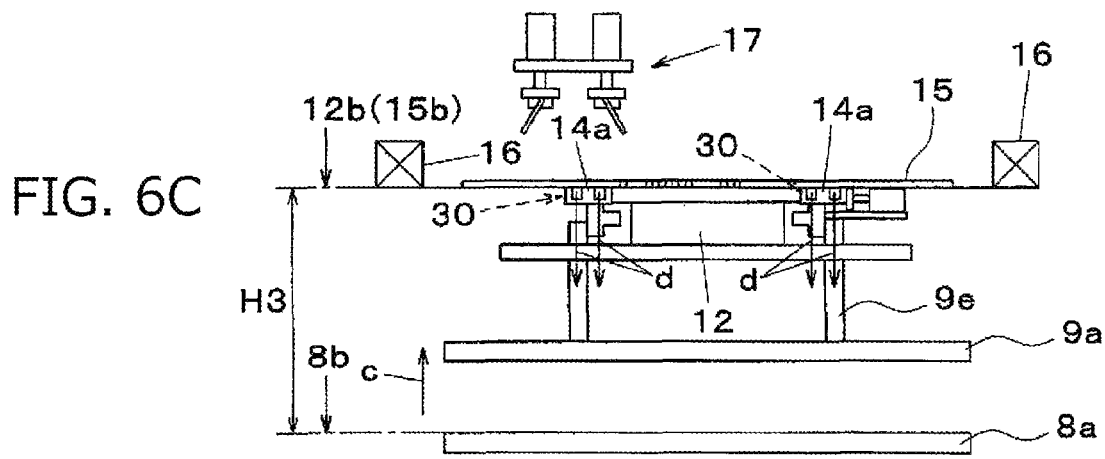

Then, as shown in FIG. 6C, together with the base plate 9a, the substrate lower receiving part 13 is upwardly moved (arrow c) and brings the substrate 12 into contact with a lower surface of the mask 15. That is, in the substrate positioning step (ST1), the substrate 12 is upwardly and downwardly moved with the substrate 12 clamped by the clamp members 14a to thereby bring the substrate 12 into contact with the mask 15 from the underside thereof and position the substrate 12 in a predetermined height position. In this state, the height position of the substrate 12 becomes a substrate height H3. This substrate height H3 is the height in which the whole area of the upper surface 12b which is a print surface of the substrate 12 should make close contact with the mask 15 with no gap in the case of assuming that the mask 15 is fixed to the frame body 16 in a state in which the mask 15 maintains a horizontal attitude. Normally, the mask 15 is fixed horizontally in a state in which a height position of a lower surface 15b of the mask 15 matches with the substrate height H3. Consequently, the substrate 12 well makes close contact with the mask 15 by matching the substrate 12 with the substrate height H3.

Then, the mask 15 in contact with the substrate 12 is sucked by the mask suction part 30 formed in the clamp member 14a (arrow d). More specifically, the mask 15 is sucked from the underside thereof by driving the vacuum suction source 35 and producing a suction force in the openings 33. Accordingly, positions of the substrate 12 with respect to the mask 15 in the vertical and horizontal directions are fixed. In addition, the substrate 12 may be upwardly moved with the suction force produced in the openings 33.

Figure 7A:
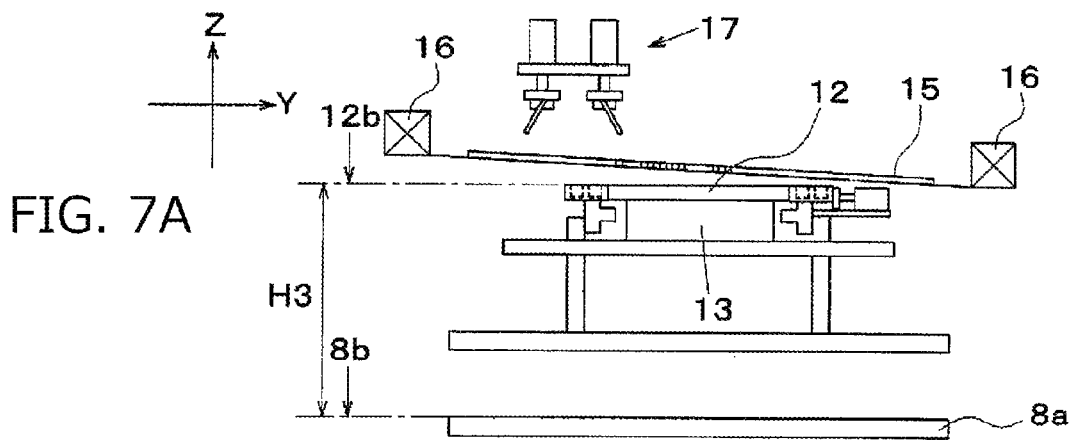
FIGS. 7A to 7C are explanatory diagrams of printing operation in the embodiment of the invention.

Next, operation in the case where strain occurs in the frame body 16 will be described with reference to FIGS. 7A to 9B. FIG. 7A shows a state in which the mask 15 is fixed to the frame body 16 in which strain occurs. This shows an example in which the mask 15 becomes inclined to the rising left in the horizontal plane by lifting one side (left side of the paper) of the frame body 16 from a regular height position by a predetermined amount. As a result, even when the substrate 12 is upwardly moved to the substrate height H3, the upper surface 12b does not make close contact with the mask 15 and is in a state having a gap. Even when squeegee operation is performed in this state, the paste Pa is not printed uniformly on the substrate 12 (or, no printing is done), with the result that a printing failure may occur. In addition, in the embodiment, an inclination of the mask 15 is largely represented in order to facilitate a visual grasp, but on the actual production site, the mask 15 is not too inclined.

Figure 7B:
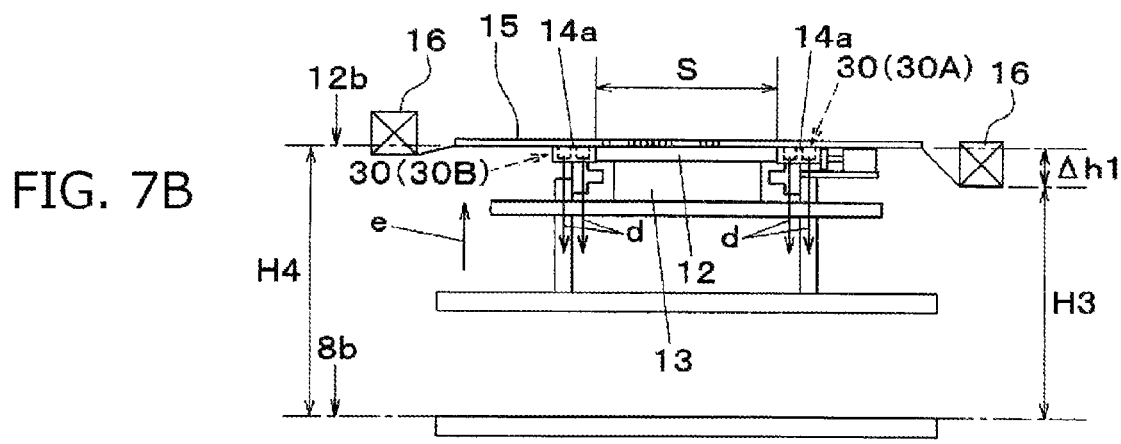

When the substrate 12 is positioned with respect to the mask 15 fixed in the inclined state caused by strain of the frame body 16 thus (ST2), the substrate lower receiving part 13 continues to be further upwardly moved even when the substrate 12 reaches the substrate height H3 as shown in FIGS. 7A and 7B (arrow e). Then, the substrate lower receiving part 13 is stopped in a position in which the mask 15 is pressed up by a predetermined amount $\Delta h1$ through the substrate 12. In this state, the height position of the substrate 12 becomes a substrate height H4. That is, the predetermined amount $\Delta h1$ by which the mask 15 is pressed up becomes a difference between the substrate height H4 and the substrate height H3.

When the substrate 12 is upwardly moved through the substrate lower receiving part 13, the vacuum suction source 35 is driven to thereby obtain a state in which a suction force is produced in the openings 33 (arrow d). Then, the mask 15 is sucked by the mask suction part 30 in a process of pressing up the mask 15 through the substrate 12. The timing at which the suction force is produced in the openings 33 may be freely selected, and may be started before the substrate 12 is upwardly moved by the substrate lower receiving part 13.

The details at the time of pressing up the mask will be described with reference to FIG. 7B. First, the mask 15 is pressed up from one side part (right side of the paper) by the substrate 12 and also is sucked by the mask suction part 30 (30A) formed in one clamp member 14a. Then, the substrate 12 continues to be upwardly moved to thereby further press up the mask 15 and at this time, the range of contact between the mask 15 and the substrate 12 follows the upper surface 12b and is gradually corrected to a horizontal attitude. Then, when the substrate 12 reaches a predetermined height position, the mask 15 is sucked by the mask suction part 30 (30B) provided in the other clamp member 14a. Accordingly, at least the substrate contact range S of the mask 15 matching with the substrate 12 in a vertical direction follows the upper surface 12b of the substrate 12 and is corrected in the horizontal attitude, and the whole area of the upper surface 12b of the substrate 12 makes close contact with the mask 15. For convenience sake, illustration of the squeegee head 17 is omitted in FIGS. 7B and 7C.

That is, in the embodiment, in the substrate positioning step (ST2), the mask 15 is pressed up by the predetermined amount $\Delta h1$ through the substrate 12 with the mask 15 sucked by the mask suction part 30 formed in the clamp member 14a when the substrate 12 is upwardly moved by the substrate positioning part 4. Accordingly, even when the mask 15 is fixed in a state deviating from the horizontal attitude due to strain of the frame body 16, the mask 15 can well be brought into close contact with the substrate 12. The predetermined amount $\Delta h1$ is determined by considering the extent of strain of the frame body 16, durability of the mask 15 on press-up stress applied at the time of press-up, etc. Then, upward movement of the substrate lower receiving part 13 is controlled after the print program is modified based on the predetermined amount $\Delta h1$ determined.

Figure 7C:
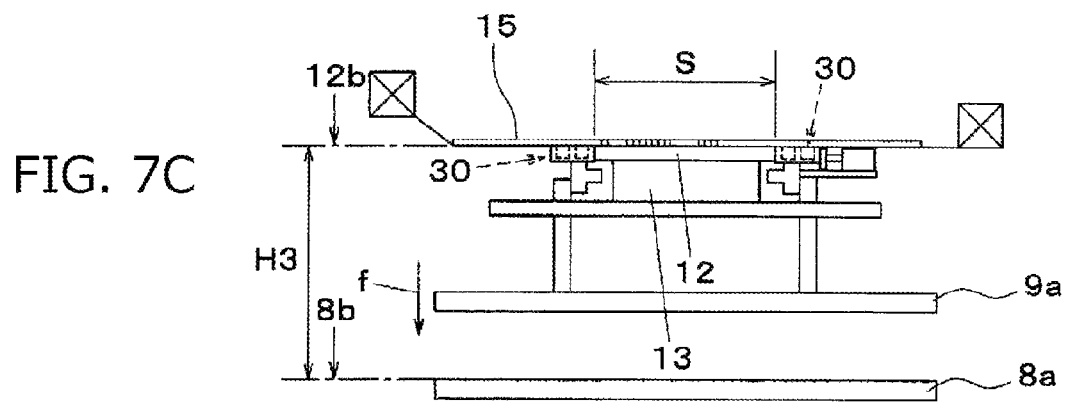

Then, as shown in FIG. 7C, with suction of the mask 15 by the mask suction part 30 maintained, the substrate lower receiving part 13 is downwardly moved by the predetermined amount $\Delta h1$ (arrow f). Accordingly, the height position of the substrate 12 returns to the substrate height H3 and press-up of the mask 15 is released. That is, the substrate 12 is moved to a height position in which press-up of the mask 15 is released with suction of the mask 15 by the mask suction part 30 maintained after the mask 15 is pressed up by the predetermined amount. At this time, the range in which the mask 15 matches with the substrate 12 in the vertical direction, that is, the substrate contact range S which is the range of contact between the mask 15 and the substrate 12 is in a state of maintaining the horizontal attitude. By downwardly moving the substrate 12 to the height position H3 in this manner, press-up stress on the mask 15 can be eased to reduce a load applied to the mask 15. In addition, as long as the substrate contact range S of the mask 15 can maintain the horizontal attitude, the height position in which press-up of the mask 15 is released is not limited to the substrate height H3, and can be set in any height position.

Figure 8A:
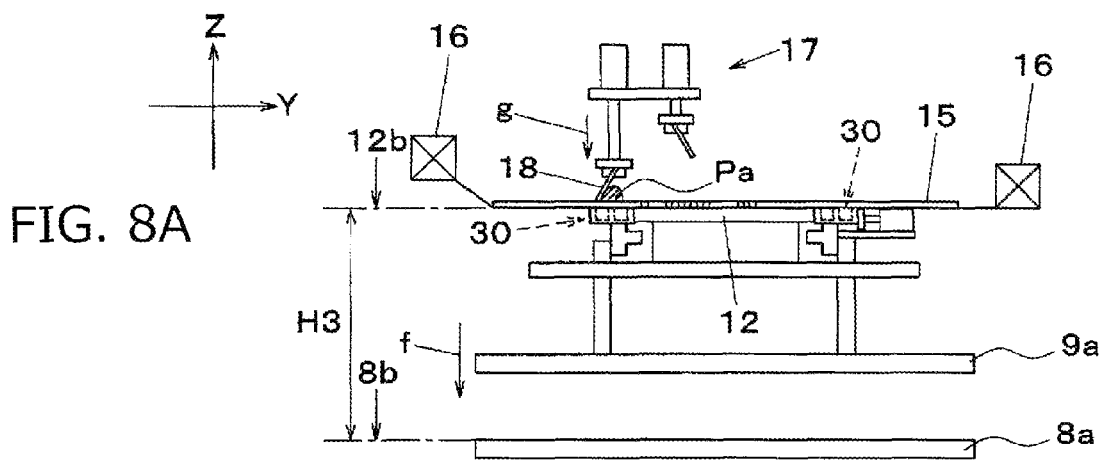
FIGS. 8A to 8C are explanatory diagrams of printing operation in the embodiment of the invention.
Figure 8B:
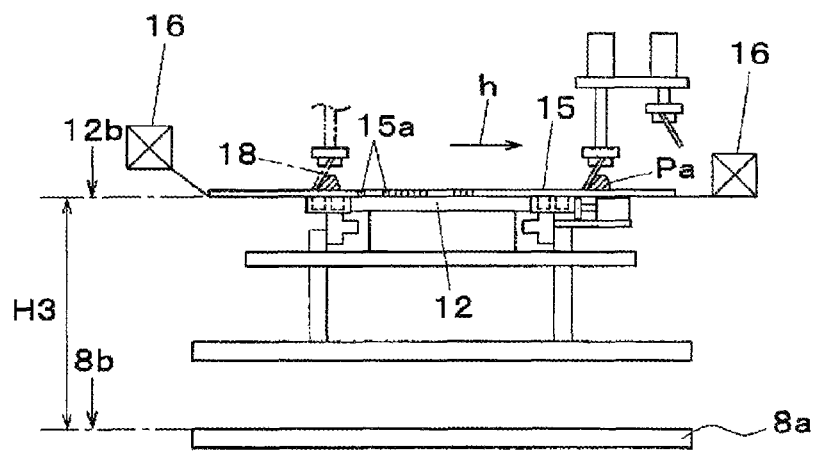
Figure 8C:
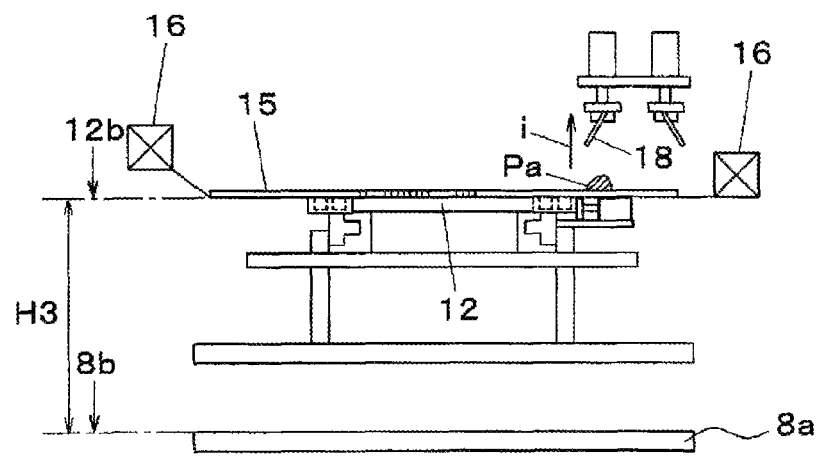

Subsequently, screen printing of the paste Pa is done (ST4: a screen printing step). That is, as shown in FIG. 8A, one squeegee 18 is downwardly moved to land on the mask 15 (arrow g). Then, as shown in FIG. 8B, the squeegee 18 performs squeegee operation of sliding on the mask 15 to which the paste Pa is supplied (arrow h). Accordingly, screen printing of the paste Pa is done on the substrate 12 through the pattern holes 15a. That is, in this step, the paste Pa is printed on the substrate 12 positioned in a predetermined height position through the pattern holes 15a by sliding the squeegee 18 on the mask 15 to which the paste Pa is supplied. Thereafter, as shown in FIG. 8C, the squeegee 18 performing the squeegee operation is upwardly moved (arrow i). In this screen printing step, a sufficient amount of paste Pa can be printed on all the electrodes 12a on the substrate 12 to print the paste Pa since the substrate 12 well makes close contact with the mask 15.

Figure 9A:
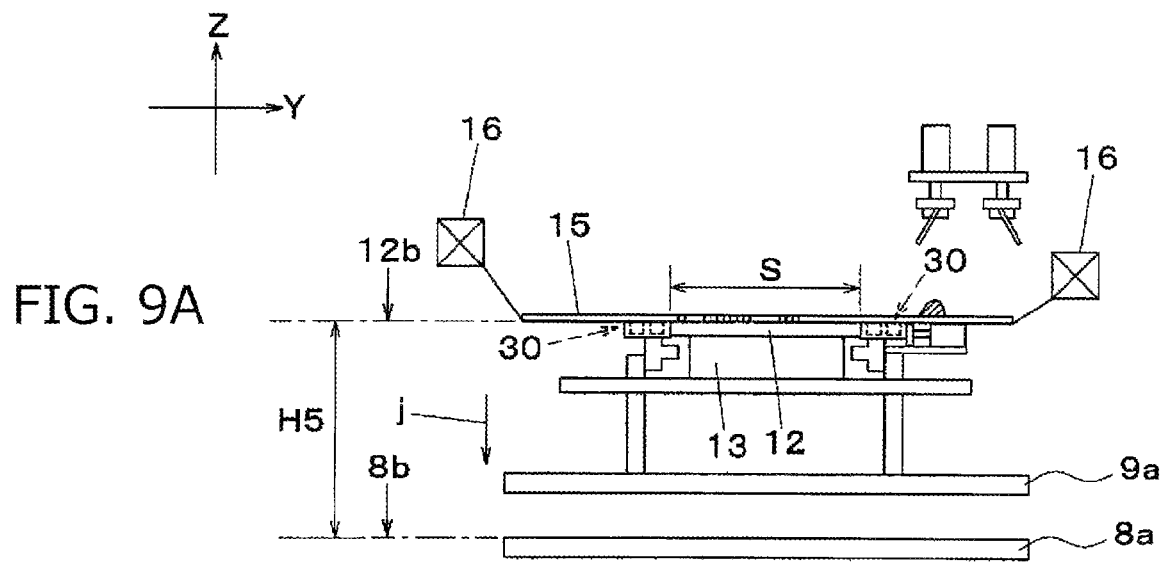
FIGS. 9A and 9B are explanatory diagrams of printing operation in the embodiment of the invention.
Figure 9B:
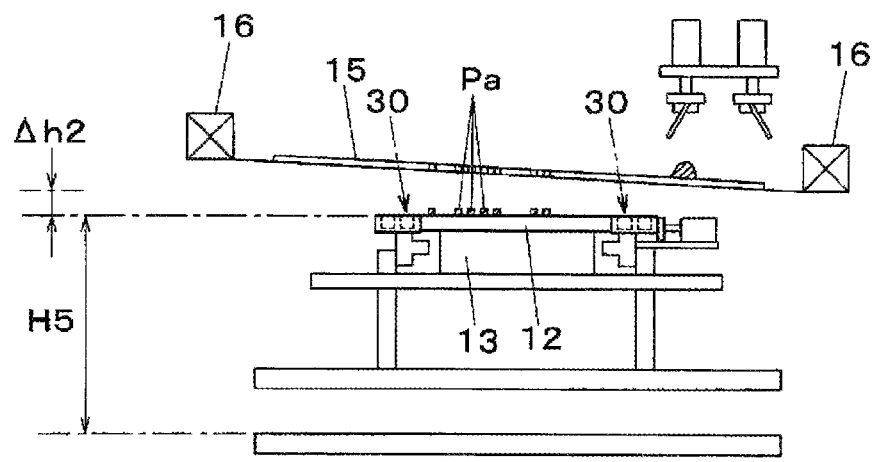

Then, plate releasing between the mask 15 and the substrate 12 is performed (ST5: a plate releasing step). That is, as shown in FIG. 9A, with suction of the mask 15 by the mask suction part 30 maintained, the substrate lower receiving part 13 is downwardly moved (arrow j). At this time, the mask 15 is also pulled downwardly, but the substrate contact range S of the mask 15 is influenced by the suction by the mask suction part 30 and remains maintaining the horizontal attitude. Then, as shown in FIG. 9B, the suction of the mask 15 by the mask suction part 30 is released at the timing at which the substrate 12 is positioned in a substrate height H5 lower from the substrate height H3 by a predetermined amount $\Delta h2$ in a process of downwardly moving the substrate lower receiving part 13. Accordingly, the mask 15 is separated from the substrate 12, and returns to the original inclined attitude. With this, a paste part Pa1 is formed on the substrate 12.

That is, when the substrate 12 is moved to a downward side separated from the mask 15 by the substrate positioning part 4 after the paste Pa is printed on the substrate 12, the mask suction part 30 keeps the mask 15 being sucked and after a start of movement of the substrate 12, the mask suction part 30 releases suction of the mask 15 in a state in which the mask 15 sucked by the mask suction part 30 maintains the horizontal attitude with respect to the substrate 12.

The plate releasing method described above has a very useful effect in the case where a print pattern becomes fine with fine pitch of the electrodes 12a formed on the substrate 12 and printing operation is performed using the ultrathin mask 15. That is, when the ultrathin mask 15 is used, only substantially the center of the mask 15 tends to be pulled downwardly in the plate releasing method. When the mask 15 is thus pulled to be bent downwardly, the paste Pa (paste part Pa1) printed in the vicinity of the side part of the substrate 12 tends to lose shape. However, according to the plate releasing method described above, the mask 15 returns to the original inclined attitude in a state in which the range (substrate contact range S) of contact with the substrate 12 maintains the horizontal attitude, with the result that after the plate releasing operation, the paste Pa printed in the vicinity of the side part of the substrate 12 can be prevented from losing shape to improve print quality.

Thus, in the screen printing apparatus M1, the electronic component mounting system 1 and the screen printing method in the embodiment, the mask 15 is pressed up by the predetermined amount through the substrate 12 with the mask 15 sucked by the mask suction part 30 when the substrate 12 is upwardly moved by the substrate positioning part 4, with the result that high-quality printing can be implemented even when the mask 15 is fixed in an inclined state.

In the embodiment, the inclination of the mask 15 is due to the strain occurring in the frame body 16, but even when the mask 15 is fixed in the inclined state for other reasons, the effect described above can be obtained by applying the embodiment.

According to the embodiment of the invention, high-quality printing can be implemented even when a mask is fixed in an inclined state, and the invention is particularly useful in the electronic component mounting field.

What is claimed is:

1. A screen printing apparatus comprising:
    a mask stretched in a frame body fixed at a predetermined height position and having at least one pattern hole formed therein;
    a substrate holder that clamps and holds a substrate at sides of the substrate by a pair of clamping members below the mask;
    a substrate positioning part that upwardly and downwardly moves the substrate clamped by the clamping members to thereby bring the substrate into contact with the mask from an underside of the mask and position the substrate in a predetermined height position;
    a mask suction part that is provided in each of the clamping members and sucks the mask in contact with the substrate;
    a screen printing part that prints paste on the substrate through the at least one pattern hole formed in the mask by sliding a squeegee on the mask to which the paste is supplied; and
    a control unit for controlling the substrate positioning part and each mask suction part such that the mask is pressed up by a predetermined amount through contact with the substrate when the substrate is upwardly moved by the substrate positioning part and the mask is sucked by each mask suction part provided in each clamp member.

2. The screen printing apparatus according to claim 1, wherein the substrate is moved to a height position in which press-up of the mask is released with suction of the mask by the mask suction part maintained after the mask is pressed up by the predetermined amount.

3. The screen printing apparatus according to claim 2, wherein when the substrate is moved to a downward side separated from the mask by the substrate positioning part after the paste is printed on the substrate, the mask suction part keeps the mask being sucked and after a start of movement of the substrate, the mask suction part releases suction of the mask in a state in which the mask sucked by the mask suction part maintains a horizontal attitude with respect to the substrate.

4. The screen printing apparatus according to claim 1, wherein when the substrate is moved to a downward side separated from the mask by the substrate positioning part after the paste is printed on the substrate, the mask suction part keeps the mask being sucked and after a start of movement of the substrate, the mask suction part releases suction of the mask in a state in which the mask sucked by the mask suction part maintains a horizontal attitude with respect to the substrate.

5. An electronic component mounting system comprising the screen printing apparatus according to claim 1, and an electronic component installation apparatus that installs an electronic component on the substrate on which the paste is printed in the screen printing apparatus.

6. An electronic component mounting system comprising the screen printing apparatus according to claim 2, and an electronic component installation apparatus that installs an electronic component on the substrate on which the paste is printed in the screen printing apparatus.

7. An electronic component mounting system comprising the screen printing apparatus according to claim 4, and an electronic component installation apparatus that installs an electronic component on the substrate on which the paste is printed in the screen printing apparatus.

8. An electronic component mounting system comprising the screen printing apparatus according to claim 3, and an electronic component installation apparatus that installs an electronic component on the substrate on which the paste is printed in the screen printing apparatus.

9. A screen printing method comprising:
    a substrate holding step of clamping and holding a substrate at sides by a pair of clamping members below a mask stretched in a frame body and fixed at a predetermined height position, the mask having at least one pattern hole formed therein;
    a substrate positioning step of upwardly and downwardly moving the substrate with the substrate clamped by the clamping members to thereby bring the substrate into contact with the mask from an underside of the mask and position the substrate in a predetermined height position; and
    a screen printing step of printing paste on the substrate through the at least one pattern hole formed in the mask by sliding a squeegee on the mask to which paste is supplied,
    wherein, during the substrate positioning step, the mask is pressed up by a predetermined amount through contact with the substrate when the substrate is upwardly moved and the mask is sucked by a mask suction part provided in each clamp member.

10. The screen printing method according to claim 9, wherein the substrate is moved to a height position in which press-up of the mask is released with suction of the mask by the mask suction part maintained after the mask is pressed up by a predetermined amount in the substrate positioning step.

11. The screen printing method according to claim 10, further comprising a plate releasing step of performing plate releasing operation by moving the substrate to a downward side separated from the mask after the paste is printed on the substrate,
    wherein in the plate releasing step, the mask suction part keeps the mask being sucked and after a start of movement of the substrate, the mask suction part releases suction of the mask in a state in which the mask sucked by the mask suction part maintains a horizontal attitude with respect to the substrate.

12. The screen printing method according to claim 9, further comprising a plate releasing step of performing plate releasing operation by moving the substrate to a downward side separated from the mask after the paste is printed on the substrate,
    wherein in the plate releasing step, the mask suction part keeps the mask being sucked and after a start of movement of the substrate, the mask suction part releases suction of the mask in a state in which the mask sucked by the mask suction part maintains a horizontal attitude with respect to the substrate.

* * * * *